United States Patent [19]

Haas et al.

[11] 4,144,488
[45] Mar. 13, 1979

[54] INVESTIGATION OF NEAR-SURFACE ELECTRONIC PROPERTIES IN SEMICONDUCTORS BY ELECTRON BEAM SCANNING

[75] Inventors: George A. Haas, Alexandria, Va.; Arnold Shih, Gaithersburg; Richard E. Thomas, Riverdale, both of Md.

[73] Assignee: The United States of America as represented by the Secretary of the Navy, Washington, D.C.

[21] Appl. No.: 863,364

[22] Filed: Dec. 22, 1977

[51] Int. Cl.² ............................................. G01R 27/02
[52] U.S. Cl. ...................................... 324/62; 250/307; 324/158 R
[58] Field of Search ................. 324/62, 158 R, 158 T; 250/307; 29/574; 313/360, 361

[56] References Cited

U.S. PATENT DOCUMENTS

| 3,146,347 | 8/1964 | Ziegler | 250/307 |
| 3,337,729 | 8/1967 | Thomas et al. | 250/307 |
| 3,341,704 | 9/1967 | Thomas et al. | 250/307 |
| 3,745,454 | 7/1973 | Nikirk et al. | 324/62 X |
| 3,876,879 | 4/1975 | McAdams et al. | 250/307 |
| 3,935,458 | 1/1976 | Peters | 324/62 X |
| 4,000,458 | 12/1976 | Miller et al. | 324/62 X |

Primary Examiner—Stanley T. Krawczewicz
Attorney, Agent, or Firm—R. S. Sciascia; Philip Schneider; William C. Daubenspeck

[57] ABSTRACT

An electron-beam scanning system for investigating the nonuniformity of (1) the work function, (2) the position of the conduction-band edge with respect to the Fermi level, and (3) the electron affinity at the surface of a single-crystal semiconductor. A small-diameter, low-energy electron beam is scanned over the surface to be investigated. The current collected by the surface for electron energies in the retarding-field region is related to the work function of the surface, whereas the current collected by the surface for electron energies in the accelerating-field region is related to the position of the conduction-band edge. The electron affinity is related to the combination of these relationships. Variations in the current collected by the surface for appropriately selected electron energies are used to provide a visual display of variations in these quantities.

11 Claims, 5 Drawing Figures

INVESTIGATION OF NEAR-SURFACE ELECTRONIC PROPERTIES IN SEMICONDUCTORS BY ELECTRON BEAM SCANNING

BACKGROUND OF THE INVENTION

This invention relates in general to the investigation of the near-surface electronic properties of semiconductors and especially to the investigation of the electron affinity and the position of the conduction-band edge with respect to the Fermi level in single-crystal semiconductors. More particularly, this invention relates to an electron-beam scanning method and apparatus for investigating the uniformity of the foregoing near-surface properties with respect to surface locations and providing a visual presentation thereof.

The near-surface properties of semiconductors are of great importance in determining the suitability of the semiconductors for a particular application and for predicting the actual operational performance of semiconductor devices. Many of these near-surface properties manifest themselves for study and analysis in the electronic properties of the surface work function $\phi$ and its two components (a) the position of the conduction-band edge $E_c$ with respect to the Fermi level and (b) the electron affinity $\chi$. The position of the conduction-band edge is governed by such band structure properties of the solid as the donor position, donor density, and ionization probability, while the electron affinity is strongly dependent on characteristics such as the surface stoichiometry, surface dipole layers, and Schottky barriers. It would be desirable to separate the work function into its two components because this will not only determine the various properties for a particular set of surface conditions, but will also quantitatively identify changes in work function as being caused by specific contributions from either or both of its components.

In the past, there was no singularly direct and reliable technique for experimentally determining these two components of the work function despite a great deal of interest in the area. Near-surface conductivity (and factors such as doping density associated with it) could only be inferred from surface potential measurements. Similarly, the electron affinity has been inferred from combining the results of separate procedures. For example, the electron affinity has been estimated from the temperature at which pore conductivity and crystal conductivity are roughly equal in oxide cathodes. It has also been derived by combining optical adsorption and photoconductivity measurements. These techniques, in addition to requiring separate experiments, also involve assumptions that give uncertainty to the estimated values, and are not generally applicable to all semiconductors.

Applicants' copending application (filed on the same day as this application) entitled "Method for Separating the Conduction-Band Edge and Electron Affinity in Semiconductors" discloses that low-energy electrons incident on a single-crystal semiconductor surface result in electron reflections corresponding to unallowed energy states in the conduction band where the Bragg condition $n\lambda = 2d$ exists (n being an integer, $\lambda$ being the DeBroglie wavelength, and d being the crystal lattice spacing normal to the surface). The relationship between energy of the incident electrons and the current collected by the semiconductor exhibits maxima and minima which are related to the position of the conduction-band edge $E_c$. The work function, $\phi$, the conduction-band edge $E_c$ and the electron affinity $\chi$ can be determined from this relationship.

However, it is also desirable to investigate the uniformity of the surface work function and each of its components. In general, the work function of a semiconductor surface is not uniform throughout the surface, but may be composed of many small regions (commonly called patches) having different values of work function. A determination of the relative contributions of $E_c$ and $\chi$ to the work function, and the variations of these quantities over the surface will provide a large amount of information about the surface properties of the semiconductor under study.

SUMMARY OF THE INVENTION

The present invention incorporates the method of the above-cited copending application in an electron-beam scanning technique to provide a kinescope presentation of variations in surface work function, electron affinity, or conduction-band edge. In addition to providing a visual presentation of the foregoing electronic properties, this provides a method of observing physical processes that take place on semiconductive surfaces such as adsorption of gases and diffusion of surface impurities, and in monitoring the effects of various processes in their application to semiconductive materials.

In the present invention, a small-diameter, low-energy electron beam is directed at and scanned over the surface of the material to be investigated. If the material is a single-crystal semiconductor, as the energy of the beam is varied through the retarding-field region (the electron energy is less than the vacuum level), and into the lower accelerating-field region (the electron energy is greater than the vacuum level but less than about 15eV), a plot of the current collected by the surface versus the energy of the incident electrons exhibits a curve that is characteristic of the surface. Variations in the retarding-field region of these curves for different areas of the surface are related to variations in the work function of the surface from area to area. Variations in the accelerating-field region of these curves are related to changes in the position of the conduction-band edge across the surface. Variations in the electron affinity across the surface may be determined by combining the variations in work function with the variations in the position of the conduction-band edge. The present invention uses the relationship between the beam energy and the collected current to produce a visual presentation of the variations in work function, position of the conduction-band edge, and electron affinity across the surface.

The preferred embodiment employs an electron-beam scanning tube having the material to be investigated mounted as the anode or target. The electrons leaving the cathode of the scanning tube are accelerated, magnetically focused, deflected, and then decelerated just before striking the target to cause the electrons to strike the target with near-zero energy. For an energy of the incident electrons in the retarding field region, the electrons are accepted or reflected depending on whether their energy is larger or smaller than the work function of the particular spot at which they are directed. A visual presentation of the work function is obtained by applying a signal related to the current collected by the target to the grid of a kinescope tube. A visual presentation of the variations in the position of the conduction-band edge is obtained if the energy of the incident electrons is in the accelerating field region of the surface. To produce a display of the variation in electron affinity, the target is first scanned with an electron beam having an energy in the retarding field region and the signals related to the current collected by the target are not applied directly to the kinescope tube but are stored for one scan. During the next sweep, the target is scanned with an electron beam having an energy in the accelerating field region. The stored signals (from the first scan) are combined with the signals from the second scan and the resultant is applied to the grid of the kinescope tube.

Additional objects and advantages of this invention will be readily appreciated as the same becomes better understood by reference to the following detailed description when considered in conjunction with the accompanying drawings wherein:

DESCRIPTION OF THE PREFERRED EMBODIMENT

Figure 1:
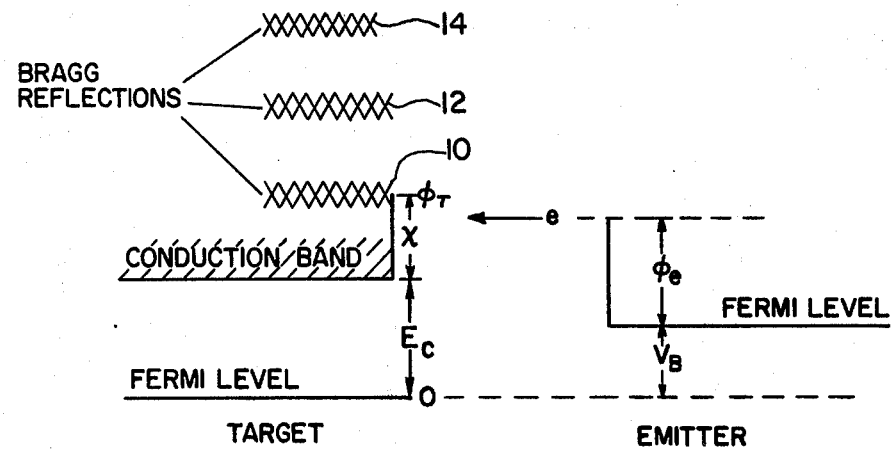
FIG. 1 is an energy-level diagram of the band structure of a semiconductor surface useful in explaining the present invention.

Referring to FIG. 1, there is shown an energy-level diagram of the band structure of a semiconductor surface which is used as a target for incident low-energy electrons. The left portion of the figure illustrates that the work function $\phi_T$ of the semiconductor surface (target) is the sum of the conduction-band edge $E_c$ and the electron affinity $\chi$. $E_c$ is the position of the conduction-band edge measured with respect to the Fermi level and $\chi$ is the difference between the vacuum level (i.e., the work function $\phi_T$) and $E_c$. The portion of the figure on the right shows an energy-level diagram of an emitter whose vacuum level (work function $\phi_e$) is changed with respect to the semiconductor target by applying a voltage $V_B$ between the emitter and the target. According to the kinematic model for electron interactions with a lattice (i.e., the nearly-free-electron single-scattering approximation), if the semiconductor is a single crystal of lattice spacing d perpendicular to the surface, unallowed energy states will exist in the conduction band where the Bragg condition $n\lambda = 2d$ exists (n being an integer and $\lambda$ being the DeBroglie wavelength of the incident electrons). If this condition can be expressed in terms of the free-electron kinetic energy, this results in the well-known relation for the energies of the Bragg reflections $$\epsilon = (h^2/2m)(\pi n/d)^2$$

where h, m and d are Planck's constant, the effective electron mass, and lattice spacing perpendicular to the surface, respectively. This may be simplified to $$\epsilon = (37/d^2)n^2 \tag{1}$$

where $\epsilon$ is the kinetic energy of the electrons in eV and d is the lattice spacing Å. Since the kinetic energy of the electron inside the semiconductor is measured with respect to the bottom of the conduction band, it is seen that the position of the reflections is directly related to the position of $E_c$. Energies corresponding to Bragg reflections are shown by the crosshatched regions 10, 12, and 14 in FIG. 1.

As illustrated by crosshatched regions 12 and 14, the electron reflections exist for energies in the conduction band above the vacuum level. Therefore, these reflections should correspond to minima in the current collected by the semiconductor for incident electron energies corresponding to the unallowed energy states.

Figure 2:
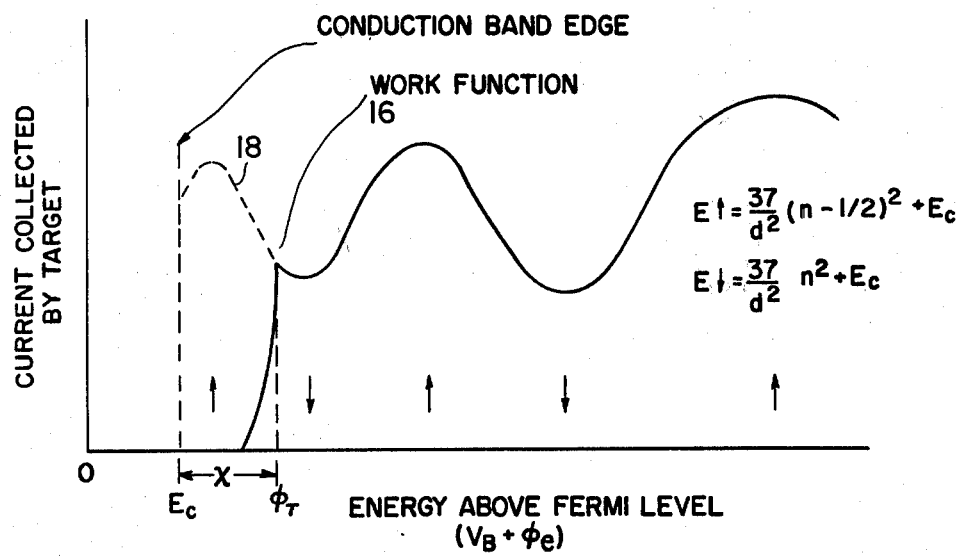
FIG. 2 is a typical plot of the current collected by a single-crystal semiconductor in the retarding-to-accelerating field region for incident low-energy electrons.

FIG. 2 shows the possible collected current which might be expected for a semiconductor having electronic surface characteristics as shown in FIG. 1, plotted as a function of the energy of $V_B + \phi_e$. This is the electron energy above the Fermi level of the semiconductor target. The minima ($\downarrow$) in this plot (which is referred to hereinafter as a low-energy electron reflection (LEER) pattern) correspond to the positions of the reflections given in equation (1) with the addition of the $E_c$ term since the energy is measured with respect to the Fermi level. Therefore $$E(\downarrow) = (37/d^2)n^2 + E_c \quad n=1,2,3 \tag{2}$$

and the abscissa of FIG. 2 is representative of the vertical energy scale of FIG. 1. Similarly maxima ($\uparrow$) of collected current exist at $$E(\uparrow) = (37/d^2)(n-\tfrac{1}{2})^2 + E_c \quad n=1,2,3 \tag{3}$$

Consequently, from equations (2) and (3), it is seen that for a given lattice spacing, the positions of the maxima and minima of the low-energy electron reflection patterns are determined by the position of the bottom of the conduction band $E_c$. The position (point 16) where the electron current joins the deviations represents the energy at which the electrons at the vacuum level of the emitter are equal to the vacuum level of the target. Hence this value represents the work function of the semiconductor; however, in many cases this vacuum level will not be so clearly defined in the LEER pattern but may be observed by a more rounded curve. The dashed line 18 represents the manner in which the deviations might appear if there were no electron-affinity barrier.

Figure 3A:
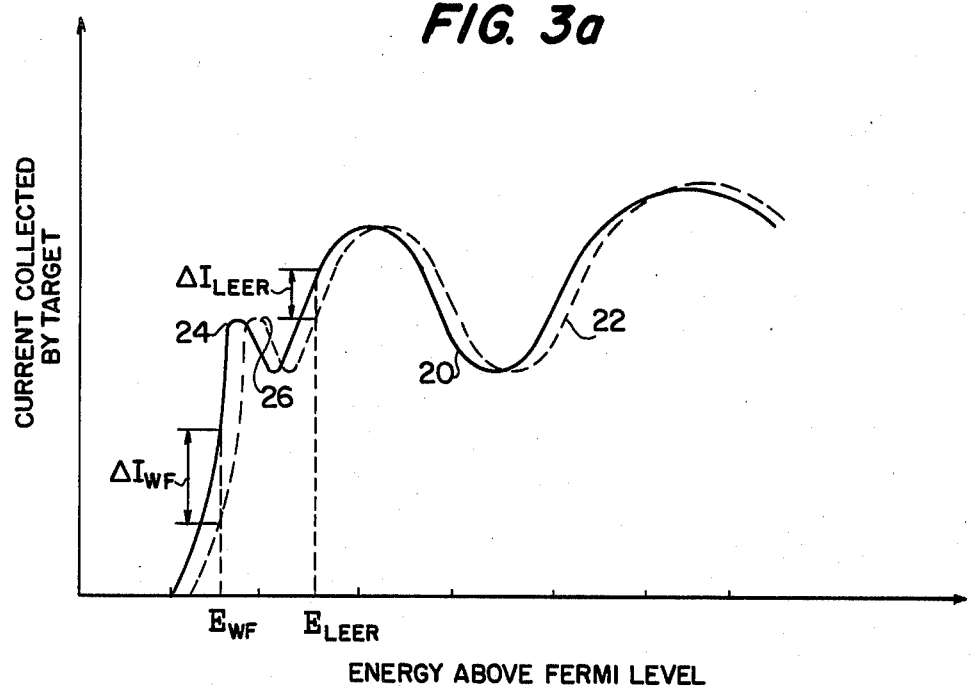
FIGS. 3a and 3b are curves that illustrate the effect that a change in the position of the conduction-band edge $E_c$ has on the collected current in the retarding-to-accelerating field region.
Figure 3B:
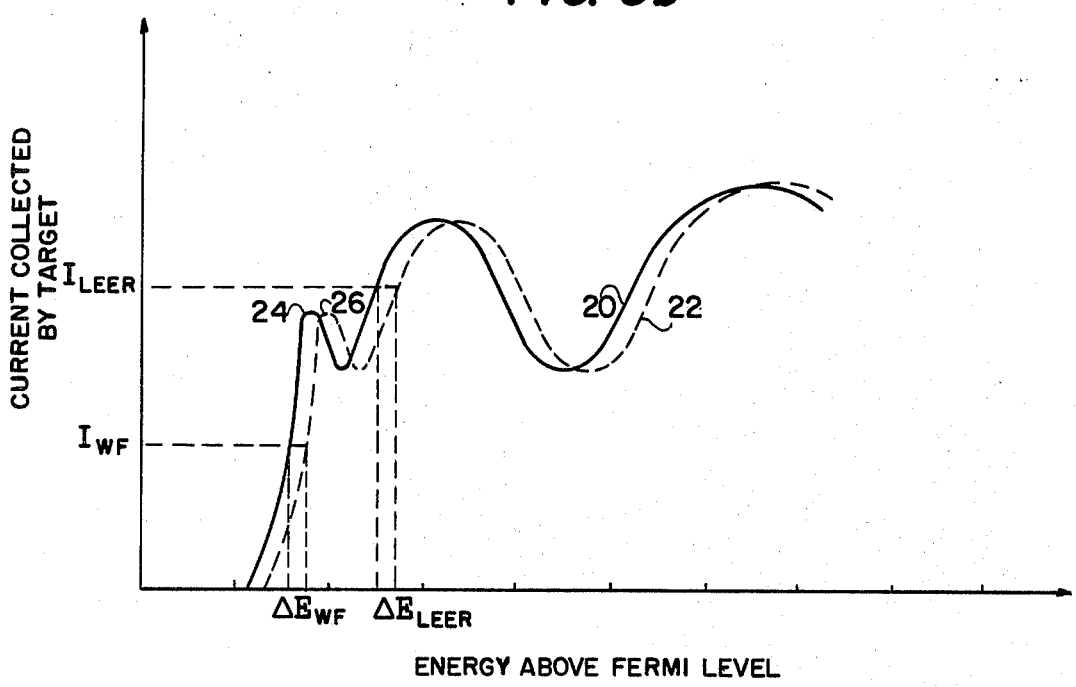

FIGS. 3a and 3b illustrate, in solid curve 20 and dashed curve 22, typical LEER patterns obtained for two areas on the semiconductor surface which have different values of $E_c$. Referring to curves 20 and 22, points 24 and 26 indicate the vacuum levels of the two areas. The portion of the LEER pattern for which the energy of the electrons at the emitter is less than the vacuum level of the target area is referred to herein as the retarding-field region of the LEER pattern. The portion for which the energy of the electrons at the emitter are greater than the vacuum level of the target area is referred to herein as the accelerating-field region of the LEER pattern. It can be seen from FIG. 3a that for an electron energy $E_{LEER}$ in the accelerating-field region of the LEER pattern, there is a change from curve 20 to curve 22 in the current collected by the semiconductor of $\Delta I_{LEER}$. This change ($\Delta I_{LEER}$) in the current collected is proportional to the difference in the position of the conduction-band edge $E_c$ for the two areas of the semiconductor surface. Similarly, it can be seen that for an electron energy $E_{WF}$ in the retarding field region of the LEER pattern, there is a change in the current collected by the semiconductor of $\Delta I_{WF}$. This change ($\Delta I_{WF}$), as known to those skilled in the art, is proportional to the difference in the work function of the two areas under study. Since the electron affinity $\chi$ of the surface is given by $\chi = \phi_T - E_c$, variations in the electron affinity may also be determined from $\Delta I_{LEER}$ and $\Delta I_{WF}$. This invention uses the changes in the LEER pattern to provide a visual presentation of variations in $E_c$, $\chi$, $\phi_T$, across the surface of the semiconductor.

It should be apparent, as illustrated in FIG. 3b, that the LEER pattern can also be analyzed in terms of the change in electron energy to maintain a constant current. For a collected current of $I_{WF}$ in the retarding-field region, there is a change in the electron energy of $\Delta E_{WF}$ from curve 20 to curve 22. Similarly for a collected current of $I_{LEER}$ in the accelerating-field region, there is a change in the electron energy of $\Delta E_{LEER}$ from curve 20 to curve 22. These changes are proportional to the difference in work function and the difference in the position of the conduction-band edge, respectively. It is also noted that the change in electron energy from curve to curve at which the accelerating-field regions exhibit corresponding maxima and minima is proportional to the changes in the position of $E_c$.

Figure 4:
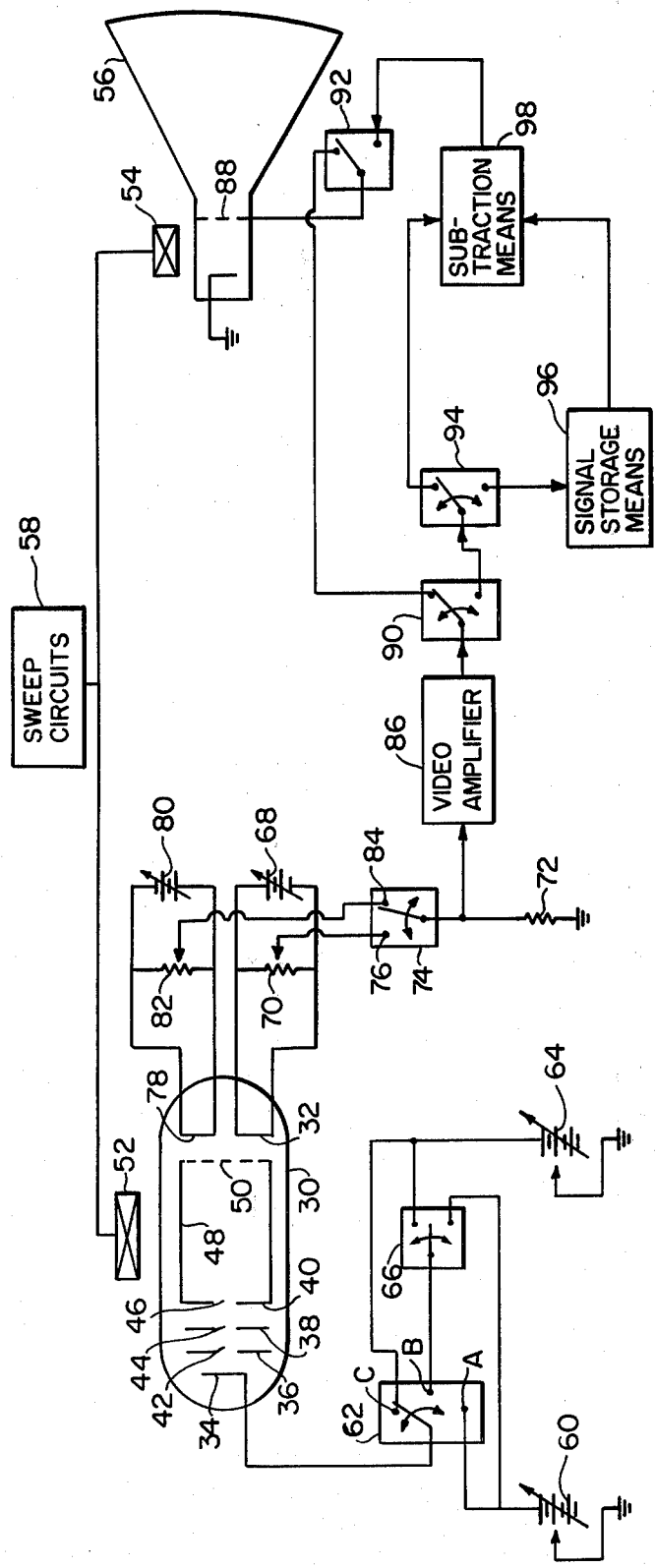
FIG. 4 is a schematic diagram of the preferred embodiment of the present invention.

Referring now to FIG. 4, the preferred embodiment of this invention includes a scanning tube 30 having the semiconductor surface to be investigated mounted as the anode or target 32. The beam scanning tube 30 is of the general type described in U.S. Pat. No. 3,337,729 entitled "Method and Apparatus for Investigating Variations in Surface Work Function by Electron Beam Scanning", issued Aug. 22, 1967. The tube includes an emitter 34 and a series of solid discs 36, 38, and 40 which act as grids and which have apertures 42, 44, 46, respectively, in their centers. The size of aperture 46 determines the resolution of the electron beam. A metal cylinder 48 is electrically connected at one end to grid 40 while the other end is connected to a fine mesh screen 50. In practice, grid 36 is connected to a source of potential approximately 10 volts positive with respect to the emitter 34 while grid 38 and grid 40 are biased by a 600 volt source and 800 volt source, respectively (the biasing sources are not shown in the figure).

The beam-scanning tube provides the proper environment for the electron gun or emitter, the beam-forming electron optics, and the surface to be investigated. The beam-scanning tube is essentially used as diode with the surface to be studied acting as a collector. The target 32 is maintained at approximately ground potential whereas the emitter 34 is biased with respect to ground by a voltage which establishes the beam energy or potential. As the electrons leave the emitter 34, they are accelerated to approximately 800 volts and then are limited by aperture 46 which defines the beam size. The electrons pass through limiting aperture 46 and enter cylinder 48 which acts as a drift space in which the electrons are magnetically deflected and focused in a conventional manner. The electrons pass through the mesh screen 50 at the end of cylinder 48 and are decelerated as they approach the target surface. The 800-volt potential applied to the screen 50 gives rise to a field of approximately 4,000 volts per centimeter in front of the target. This serves to overcome localized patch fields and therefore permits the observation of the finer detail that can be shrouded by these patch fields.

The horizontal and vertical deflection circuits 52 of the scanning tube 30 are connected to the horizontal and vertical deflection circuits 54 of a kinescope tube 56. The deflections of the scanning tube 30 and the kinescope tube 54 are synchronized with each other and are controlled by horizontal and vertical sweep circuits 58. By adjusting the gain and centering controls of the horizontal and vertical deflection circuits 52 of the scanning tube, it is possible to scan the entire target surface, a small portion of it, or to actually stop the beam on a particular spot of the surface.

The emitter 34 of scanning tube 30 is connected to a first beam energy control voltage source 60 when three-position switch 62 has its pole coupled to contact A and to a second beam energy control source 64 when the pole is coupled to contact C. The first and second beam energy control voltage sources 60 and 64 bias the emitter 34 to provide a beam energy in the retarding-field region and accelerating-field region, of the LEER pattern, respectively. The third position of switch 62 (contact B) couples the emitter 34 to a first alternating electronic switch 66 which has its pole connected to the first beam energy control voltage source 60 in its first position and connected to the second beam energy control voltage source 64 in its second position. The switching of the first alternating electronic switch 66 is synchronized with the end of the scan of the target. At the end of each sweep, the position of switch 66 changes so that the voltage applied to emitter 34 alternates between the first and the second beam energy control voltage sources.

The target (anode) 32 is connected to a target heater voltage supply 68 which provides a means for heating the semiconductor surface while scanning in order to observe changes in surface properties that may be temperature-dependent. A nulling resistor 70, coupled in parallel with the target 32, compensates for the current from target heater supply 68. The tap of the nulling resistor 70 is coupled to ground through a resistor 72 when a first single-pole, double-throw (SPDT) switch 74 has its pole coupled to contact 76. A signal proportional to the number of electrons received by the target 32 from the electron beam is developed across the resistor 72. A ribbon 78 made of tungsten or any other suitable material serves as a work-function reference and is externally connected to a voltage source 80 whenever a switch (not shown) is closed in order to heat and thereby clean the ribbon surface. The tap of a second nulling resistor 82 is connected to the resistor 72 when the first SPDT switch 74 has its pole coupled to contact 84. The signal developed across resistor 72 will then be proportional to the number of electrons received by the reference ribbon 78. The current collected by the target or the reference may also be measured if the taps of nulling resistors 70 and 82 are coupled to an electrometer (not shown) instead of resistor 74.

The signal developed across the resistor 72 is converted in a conventional video amplifier network 86 to a form suitable for application to the control grid 88 of the kinescope tube 56. Amplifier network 86 includes an A.C. amplifier (not shown), a D.C. restorer (not shown) providing a D.C. reference so that all signals from the A.C. amplifier are positive-going with respect to zero, and a D.C. amplifier (not shown) providing a preselected reference level for biasing the control grid 88 of the kinescope tube 56.

The output of the video amplifier network 86 is a signal which is proportional to the number of electrons received by the target from the electron beam. Depending on the energy of the electron beam during a particular scan (determined by the position of the three-position switch 62 and the first alternating electronic switch 66), variations in the signal as the electron beam scans the surface of the target 32 will be proportional to changes in the position of $E_c$ or proportional to changes in the work function $\phi_T$. It is apparent that the output of amplifier 86 may be applied directly to the control grid 88 of kinescope tube 56 to obtain a visual presentation of the variations of $E_c$ and $\phi_T$ across the surface; however, to display variations in the electron affinity $\chi$, the variations in $E_c$ and $\phi_T$ are combined to form a resultant signal. Accordingly, in order to selectively display the variations in $E_c$, variations in $\phi_T$, and variations in $\chi$ over the scanned surface, the output of video amplifier network 86 is not applied directly to the control grid 88, but undergoes further switching and processing. To that effect, the signal is coupled to the pole of a second SPDT switch 90. When the switch 90 is in a first position, the signal is coupled from the video amplifier network 86 through switch 90 and through a first position of a third SPDT switch 92 to the control grid 88. Connection of this path displays the variation of $E_c$ or $\phi_T$ on the kinescope tube 56.

To display the variation in electron affinity across the target surface, the second and third SPDT switches 90 and 92 are set to their second position. The signal is then coupled from the video amplifier network through switch 90 to the pole of a second alternating electronic switch 94 which is synchronized with the first alternating electronic switch 66. During a first sweep, when the first alternating switch 66 has its pole connected to the first beam energy control voltage source 60 (the video amplifier output varies as $\phi_T$ varies), the second alternating electronic switch 94 couples the signal to a signal storage means 96. The signal storage means stores the signals received during the first sweep and transmits them through a variable gain means (not shown) to one input of a subtraction means 98 during the succeeding (second) sweep. The alternating electronic switches 66 and 94 are switched to their alternate positions at the end of the first sweep. During the second sweep, the output of the video amplifier network 86 (which varies as $E_c$ varies across the surface) is applied through the second alternating electronic switch to the other input of the subtraction means 98. The output of the subtraction means, a signal proportional to the variation of $\chi$ across the target surface is coupled through the third SPDT switch 92 to the control grid 88 for display.

In operation, an electron beam is scanned over the entire target, a small portion of it, or stopped on a particular spot. The beam diameter is chosen for the resolution desired, although a beam diameter of approximately five microns is contemplated in the preferred embodiment. To produce a visual display of the position of the conduction-band edge $E_c$, three position switch 62 is positioned so that the second beam energy control voltage source 64 is applied to the emitter 34. The voltage from source 64 established a beam energy (accelerating potential in this case) of the electrons directed at the target 32. The first SPDT switch 74 is positioned so that the target 32 is coupled through contact 70 to the resistor 72. As the beam scans the surface of target 32 the current received by the target at the particular beam energy appears as a video signal across the resistor 72.

This signal is amplified and coupled through second and third SPDT switches 90 and 92 to the control grid 88 to modulate the beam of the kinescope tube 56. Since the sweep circuits of the scanning tube 30 and kinescope tube 56 are synchronized, the kinescope provides a continuous television display of the variation of the conduction-band edge on the scanned surface.

If a visual display of the work function $\phi_T$ of the surface is desired, three-position switch 62 is positioned so that the first beam energy control voltage source 60 is applied to the emitter 34, while switches 90 and 92 are set to their first position. A beam energy in the retarding region of the LEER pattern is established in this case and the video signal developed across resistor 72 varies according to the work function $\phi_T$ of the scanned surface.

The kinescope tube 56 will display variations in the electron affinity over the scanned surface when three-position switch 62 is set to position B, the second and the third SPDT switches 90 and 92 are set to their second position, and the target 34 is coupled to the resistor 72 through the first SPDT switch 74. The voltage applied to the emitter 34 will alternate between voltage source 60 and voltage source 64, from sweep to sweep, causing the changes in the video signal developed across resistor 72 to alternately be proportional to variations in $E_c$ and variations in $\phi_T$. The signals corresponding to variations in $\phi_T$ are stored for one sweep in the signal storage means 96 and then combined in the subtraction means 98 with the signals (generated on the next sweep) corresponding to variations in $E_c$. The output of the subtraction means 98 modulates the beam of the kinescope tube 56 to provide a continuous display of variations in $\chi$ over the scanned surface.

It is noted that the energy of the incident electron beam should be based on the actual LEER pattern of the surface under investigation. For a single crystal, the general shape of the LEER pattern is not expected to vary greatly from area to area. Thus, in general, the LEER patterns for the surface are expected to be in the form of similar curves, as shown by curves 20 and 22 in FIGS. 3a and 3b. Accordingly, the beam energies are chosen so as to monitor the current collected by each area of the surface at approximately the same section of their respective LEER patterns. For example, in FIG. 3, $E_{WF}$ lies in the retarding region of both curve 20 and curve 22 and $E_{LEER}$ lies in the accelerating region between the first observed minimum ( ↓ ) and maximum ( ↑ ) in both curve 20 and curve 22.

In addition to providing a kinescope presentation where the variation in $\phi_T$, $E_c$ and $\chi$ are indicated by the relative brightness of the different areas of the scanned surface, a quantitative measurement of these characteristics may be obtained. When the electron beam is directed at the reference ribbon 78 (made of a material having a well-known and easily maintained work function) and the current collected by the reference ribbon is coupled to resistor 72, a signal proportional to the work function of the reference will be developed across the resistor 72. This signal may be used to calibrate the display of the contrasting regions found in the scan of the semiconductor surface. If the electron beam is held stationary on a spot and the current collected by the target is measured (by an electrometer, for example) while the beam energy is varied from the retarding region through the accelerating region, the LEER pattern of the spot may be obtained. As is well-known, the actual value of the work function can be obtained from comparison of the LEER pattern with the retarding pattern of the work-function reference. The actual values of $E_c$ and $\chi$ can be obtained from analysis of the maxima and minima of the LEER pattern in conjunction with the relationships given by equations (2) and (3). A more thorough discussion of the analysis of the LEER patterns is found in Applicants' earlier-cited copending application.

Obviously many modifications and variations of the present invention are possible in light of the above teachings. For example, in the preferred embodiment of FIG. 4, the energy of the electron beam was set to a specific value (determined as previously explained) and the variation in current collected by the target as the beam was scanned over the surface was used to produce a signal for display on the kinescope tube. However, as is apparent from inspection of FIG. 3b, an appropriate signal may be produced if the energy of the electron beam is varied to maintain a constant collected current across the surface. In this case, the changes in the beam voltage are proportional to the changes in surface electronic properties. For example, consider operation in the retarding-field region of the LEER pattern or in the accelerating-field region between the first minimum and first maximum. If the current collected by the target is fed to a circuit which varies the voltage applied to the emitter in such a fashion as to keep the collected current constant, the changes in the emitter voltage are equal to the changes in work function or the position of $E_c$ over the surface, respectively. This voltage can be displayed on the kinescope. An alternative method of operation in the accelerating region involves comparison of one or more extrema (maxima or minima) in the LEER patterns or one or more regions maximum slope (extrema of derivative curve) of the LEER patterns. If the collected current or its derivative function is fed into a standard minimum (or maximum) detection circuit, the output of this circuit may be fed back to change the voltage applied to the emitter in such a fashion as to maintain the chosen current point. Changes in the emitter voltage are equal to changes in the position conduction-band edge $E_c$ and can be displayed of the kinescope. Obviously, these two signals may be combined to provide a display of $\chi$ in the same manner as contemplated in the embodiment of FIG. 4.

It is therefore to be understood, that within the scope of the appended claims, the invention may be practiced otherwise than as described.

What is claimed and desired to be secured by Letters Patent of the United States is:

1. A method of investigating the variations in the position of the conduction-band edge $E_c$ with respect to the Fermi level over the surface of a single-crystal semiconductor, which comprises:
   (a) scanning the surface to be investigated with a beam of electrons at an energy in the accelerating-field region of said surface;
   (b) varying the energy of said beam of electrons to maintain the current collected by said target at a constant value;
   (c) producing a signal representative of the variations in the energy of said beam; and
   (d) applying the signal to the input of a display tube while synchronously scanning the display tube and the surface, a visual presentation being produced wherein bright and dark areas of the presentation represent variations in the position of the conduction-band edge $E_c$ across the surface.

2. A method of investigating the surface electronic properties of a single-crystal semiconductor, which comprises the steps of:
   (a) scanning the surface to be investigated with a beam of electrons at a first energy, said first energy being in the retarding-field region of the surface;
   (b) producing a first signal representative of the amount of current collected by the surface at said first energy;
   (c) storing said first signal;
   (d) scanning the surface to be investigated with a beam of electrons at a second energy, said second energy being in the accelerating-field region of the surface;
   (e) producing a second signal representative of the amount of current collected by the surface at said second energy;
   (f) subtracting a signal related to said second signal from a signal related to said stored first signal to produce a combined signal;
   (g) visually displaying said second signal, a visual presentation being produced wherein bright and dark areas of the presentation represent variations in the position of the conduction-band edge $E_c$ across the surface; and
   (h) visually displaying said combined signal, a visual presentation being produced wherein bright and dark areas of the presentation represent variations in the electron affinity $\chi$ across the surface.

3. A method of investigating the variation in the position of the conduction-band edge $E_c$ with respect to the Fermi level over the surface of a single-crystal semiconductor, which comprises the steps of:
   (a) scanning the surface to be investigated with a beam of electrons at an energy in the accelerating-field region of said surface;
   (b) producing a signal representative of the amount of current collected by the surface at said energy; and
   (c) visually displaying the signal, a visual presentation being produced wherein bright and dark areas of the presentation represent variations in the position of the conduction-band edge $E_c$ across the surface.

4. A method of investigating the variation in the electron affinity over the surface of a single-crystal semiconductor, which comprises the steps of:
   (a) scanning the surface to be investigated with a beam of electrons at a first energy, said first energy being in the retarding-field region of the surface;
   (b) producing a first signal representative of the amount of current collected by the surface at said first energy;
   (c) storing said first signal;
   (d) scanning the surface to be investigated with a beam of electrons at a second energy, said second energy being in the accelerating-field region of the surface;
   (e) producing a second signal representative of the amount of current collected by the surface at said second energy;
   (f) subtracting a signal related to said second signal from a signal related to said stored first signal to produce a combined signal; and
   (g) visually displaying the combined signal, a visual presentation being produced wherein bright and dark areas of the presentation represent variations in the electron affinity across the surface.

5. A method of investigating the variation in the electron affinity over the surface of single-crystal semiconductor, which comprises the steps of:
 (a) scanning the surface to be investigated with a beam of electrons at an energy in the retarding-field region of said surface;
 (b) varying the energy of said beam of electrons in the retarding-field region to maintain the current collected by said target at a constant value;
 (c) producing a first signal representative of the variations in the energy of said beam in the retarding-field region;
 (d) storing said first signal;
 (e) scanning the surface with a beam of electrons at an energy in the accelerating-field region of said surface;
 (f) varying the energy of said beam of electrons in the accelerating-field region to maintain the current collected by said target at a constant value;
 (g) producing a second signal representative of the variations in the energy of said beam in the accelerating-field region;
 (h) subtracting a signal related to said second signal from a signal related to said first signal to produce a combined signal; and
 (i) applying the combined signal to the input of a display tube while synchronously scanning the display tube and the surface, a visual presentation being produced wherein bright and dark areas of the presentation represent variations in the position of the electron affinity across the surface.

6. Apparatus for investigating the variation in the position of the conduction-band edge $E_c$ with respect to the Fermi level over the surface of a single-crystal semiconductor, which comprises:
 (a) means for scanning the surface to be investigated with a beam of electrons at an energy in the accelerating-field region of said surface;
 (b) means for producing a signal representative of the amount of current collected by the surface at said energy; and
 (c) means for visually displaying the signal, a visual presentation being produced wherein bright and dark areas of the presentation represent variations in the position of the conduction-band edge $E_c$ across the surface.

7. Apparatus for investigating the variation in the electron affinity over the surface of a single-crystal semiconductor, which comprises:
 (a) means for scanning the surface to be investigated with a beam of electrons at a first energy, said first energy being in the retarding-field region of the surface;
 (b) means for producing a first signal representative of the amount of current collected by the surface at said first energy;
 (c) means for storing said first signal;
 (d) means for scanning the surface to be investigated with a beam of electrons at a second energy, said second energy being in the accelerating field region of the surface;
 (e) means for producing a second signal representative of the amount of current collected by the surface at said second energy;
 (f) means for subtracting a signal related to said second signal from a signal related to said stored first signal to produce a combined signal; and
 (g) means for visually displaying the combined signal, a visual presentation being produced wherein bright and dark areas of the presentation represent variations in the electron affinity across the surface.

8. Apparatus for investigating the variations in the position of the conduction-band edge $E_c$ with respect to the Fermi level over the surface of a single-crystal semiconductor, which comprises:
 (a) means for scanning the surface to be investigated with a beam of electrons at an energy in the accelerating-field region of said surface;
 (b) means for varying the energy of said beam of electrons to maintain the current collected by said target at a constant value;
 (c) means for producing a signal representative of the variations in the energy of said beam; and
 (d) means for applying the signal to the input of a display tube while synchronously scanning the display tube and the surface, a visual presentation being produced wherein bright and dark areas of the presentation represent variations in the position of the conduction-band edge $E_c$ across the surface.

9. Apparatus for investigating the variation in the electron affinity over the surface of single-crystal semiconductor, which comprises:
 (a) means for scanning the surface to be investigated with a beam of electrons at an energy in the retarding-field region of said surface;
 (b) means for varying the energy of said beam of electrons in the retarding-field region to maintain the current collected by said target at a constant value;
 (c) means for producing a first signal representative of the variations in the energy of said beam in the retarding-field region;
 (d) means for storing said first signal;
 (e) means for scanning the surface with a beam of electrons at an energy in the accelerating-field region of said surface;
 (f) means for varying the energy of said beam of electrons in the accelerating-field region to maintain the current collected by said target at a constant value;
 (g) means for producing a second signal representative of the variations in the energy of said beam in the accelerating-field region;
 (h) means for subtracting a signal related to said second signal from a signal related to said first signal to produce a combined signal; and
 (i) means for applying the combined signal to the input of a display tube while synchronously scanning the display tube and the surface, a visual presentation being produced wherein bright and dark areas of the presentation represent variations in the position of the electron affinity across the surface.

10. Apparatus for investigating the surface electronic properties of a single-crystal semiconductor which comprises:
 (a) means for scanning the surface to be investigated with a beam of electrons;
 (b) first means coupled to said scanning means for controlling the energy of said beam of electrons, said first means providing a beam energy in the accelerating-field region of said surface;
 (c) means coupled to said semiconductor for producing a signal related to the amount of current collected by the surface; and (d) means for visually displaying said signal, a visual presentation being produced wherein bright and dark areas of the presentation represent variations in the position of the conduction-band edge across the surface.

11. Apparatus as recited in claim 10 further comprising:
(a) second means for controlling the energy of said beam of electrons, said second means providing a beam energy in the retarding-field region of said surface;
(b) first switching means for alternately coupling said first beam energy controlling means and said second beam energy controlling means to said scanning means to provide a beam energy in the retarding-field region on a first scan and a beam energy in the accelerating field region on a second scan;
(c) means for subtracting two input signals to produce a combined output signal;
(d) means for storing an input signal received during a scan of said scanning means, the stored signal coupled to said subtraction means during the succeeding scan of said scanning means;
(e) second switching means for coupling said signals related to the amount of current collected by the surface to said storing means when said beam energy is in the retarding-field region and to said subtraction means when said beam energy is in the accelerating-field region; and
(f) means for visually displaying said combined output signal, a visual presentation being produced wherein bright and dark areas of the presentation represent variations in the electron affinity across the surface.

* * * * *